(12) United States Patent
Verma et al.

(10) Patent No.: US 9,679,828 B2
(45) Date of Patent: Jun. 13, 2017

(54) SYSTEM-ON-CHIP ELECTRONIC DEVICE WITH APERTURE FED NANOFILM ANTENNA

(71) Applicant: Amit Verma, Pearland, TX (US)

(72) Inventors: Amit Verma, Pearland, TX (US); Fabio Urbani, Torrance, CA (US); David W. Stollberg, Acworth, GA (US)

(73) Assignee: Amit Verma, Cypress, TX (US)

( * ) Notice: Subject to any disclaimer, the term of this patent is extended or adjusted under 35 U.S.C. 154(b) by 158 days.

(21) Appl. No.: 13/755,803

(22) Filed: Jan. 31, 2013

(65) Prior Publication Data

US 2013/0200430 A1    Aug. 8, 2013

Related U.S. Application Data

(60) Provisional application No. 61/592,891, filed on Jan. 31, 2012.

(51) Int. Cl.

| | |
|---|---|
| *H01Q 9/04* | (2006.01) |
| *H01L 23/48* | (2006.01) |
| *H01L 21/02* | (2006.01) |
| *H01L 23/522* | (2006.01) |
| *H01Q 1/22* | (2006.01) |
| *H01L 23/66* | (2006.01) |
| *B82Y 40/00* | (2011.01) |
| *B82Y 30/00* | (2011.01) |

(52) U.S. Cl.
CPC .......... *H01L 23/48* (2013.01); *H01L 21/0237* (2013.01); *H01L 23/5227* (2013.01); *H01L 23/66* (2013.01); *H01Q 1/2283* (2013.01); *H01Q 9/0457* (2013.01); *B82Y 30/00* (2013.01); *B82Y 40/00* (2013.01); *H01L 2223/6677* (2013.01); *H01L 2924/0002* (2013.01); *Y10S 977/742* (2013.01); *Y10S 977/755* (2013.01)

(58) Field of Classification Search
CPC ......... H01L 2223/6677; H01L 23/5227; Y10S 977/755; H01Q 1/2283; H01Q 9/0457
See application file for complete search history.

(56) References Cited

U.S. PATENT DOCUMENTS

| | | | |
|---|---|---|---|
| 5,767,808 A | * | 6/1998 | Robbins ............... H01Q 9/0407 343/700 MS |
| 7,015,861 B2 | | 3/2006 | Boyd et al. |
| 7,898,481 B2 | | 3/2011 | Qian et al. |

(Continued)

OTHER PUBLICATIONS

Fabio Urbani et al., "Outstanding Performance of a Nanofilm Microstrip Antenna," Oct. 12-15, 2010 IEEE Nanotechnology Materials and Devices Conference, pp. 160-163.*

(Continued)

*Primary Examiner* — Matthew Landau
*Assistant Examiner* — Mark Hatzilambrou
(74) *Attorney, Agent, or Firm* — Allen, Dyer, Doppelt & Gilchrist, P.A.

(57) ABSTRACT

An electronic device may include a first substrate, an electrically conductive feed line on the first substrate, an insulating layer on the first substrate and the electrically conductive feed line, a second substrate on the insulating layer, and an antenna on the second substrate and having nanofilm layers stacked on the second substrate. The antenna is coupled to the feed line through an aperture.

16 Claims, 3 Drawing Sheets

(56) References Cited

U.S. PATENT DOCUMENTS

| | | | | |
|---|---|---|---|---|
| 2004/0263393 | A1* | 12/2004 | Lynch et al. | 343/700 MS |
| 2007/0241962 | A1 | 10/2007 | Shinoda et al. | |
| 2008/0252543 | A1* | 10/2008 | Pettus | 343/793 |
| 2009/0015483 | A1* | 1/2009 | Liu | H01Q 9/0457 343/700 MS |
| 2009/0231205 | A1* | 9/2009 | Burke | H01Q 9/0442 343/700 MS |
| 2010/0097273 | A1* | 4/2010 | Biris et al. | 343/700 R |
| 2011/0133995 | A1 | 6/2011 | Pascolini et al. | |
| 2011/0279190 | A1* | 11/2011 | Liu et al. | 333/35 |

OTHER PUBLICATIONS

Guo-Min Yang et al., "Tunable Miniaturized Patch Antennas With Self-Biased Mujltilayer Magnetic Films," Jul. 2009, IEEE Transactions on Antennas and Propagation, vol. 57, No. 7, pp. 2190-2193.*

Yijun Zhou et al., "Polymer-Carbon Nanotube Sheets for Conformal Load Bearing Antennas," Jul. 2010, IEEE Transactions on Antennas and Propagation, vol. 58, No. 7, pp. 2169-2175.*

* cited by examiner

SYSTEM-ON-CHIP ELECTRONIC DEVICE WITH APERTURE FED NANOFILM ANTENNA

RELATED APPLICATIONS

This application is based upon prior filed provisional application Ser. No. 61/592,891 filed Jan. 31, 2012, the entire subject matter of which is incorporated herein by reference in its entirety.

FIELD OF THE INVENTION

The present invention relates to the field of electronic devices, and, more particularly, to electronic devices with integrated antennas and related methods.

SUMMARY OF THE INVENTION

In view of the foregoing background, it is therefore an object of the present invention to provide electronic device with an integrated antenna that is robust.

This and other objects, features, and advantages in accordance with the present invention are provided by an electronic device comprising a first substrate, an electrically conductive feed line on the first substrate, an insulating layer on the first substrate and the electrically conductive feed line, a second substrate on the insulating layer, and an antenna on the second substrate and comprising a plurality of nanofilm layers stacked on the second substrate. Advantageously, the antenna may be integrated with other components on the first substrate.

More specifically, the electronic device may comprise an electrically conductive ground plane layer between the insulating layer and the second substrate. The insulating layer and the second substrate may define an aperture extending from the first substrate to the antenna for coupling the electrically conductive feed line to the antenna.

In some embodiments, each of the plurality of nanofilm layers comprises a carbon nanotube film layer configured to be electrically conductive. The electronic device further may comprise at least one integrated circuit (IC) component on the first substrate and coupled to the electrically conductive feed line.

For example, the insulating layer may comprise at least one of a silicon dioxide layer and a dielectric laminate layer. The first substrate may comprise at least one of a silicon layer, and a Gallium Arsenide layer. The second substrate may comprise a silicon layer, and a silicon dioxide layer.

Another aspect is directed to a method of making an electronic device. The method may comprise forming a first substrate, forming an electrically conductive feed line on the first substrate, and forming an insulating layer on the first substrate and the electrically conductive feed line. The method may also include forming a second substrate on the insulating layer, and forming an antenna on the second substrate, the antenna comprising a plurality of nanofilm layers stacked on the second substrate.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1A:
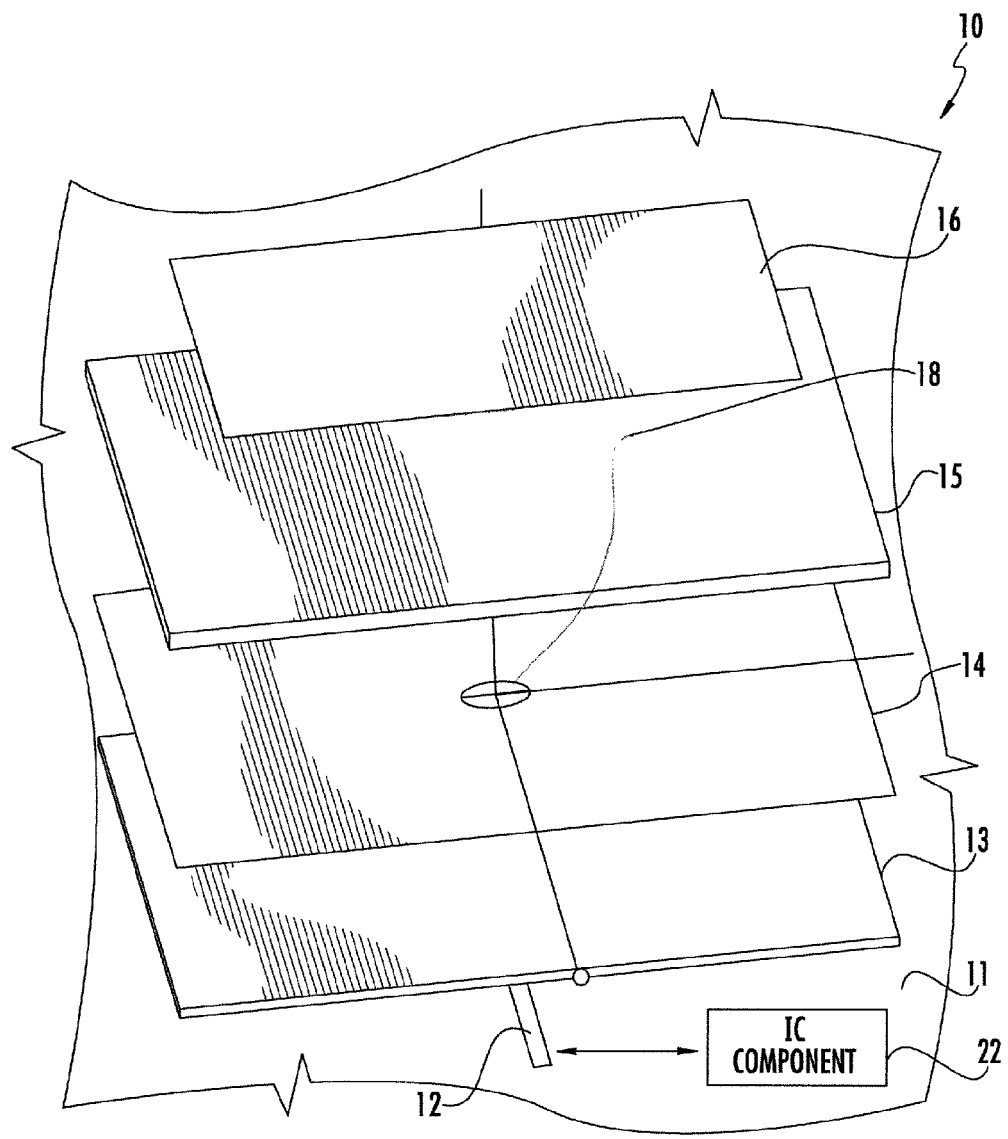
FIG. 1A is a schematic diagram of an exploded view of an electronic device, according to the present invention.
Figure 1B:
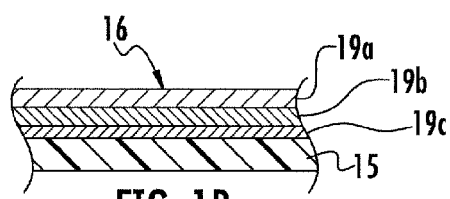
FIG. 1B is a cross-sectional view of a portion of the electronic device of FIG. 1.
Figure 2:
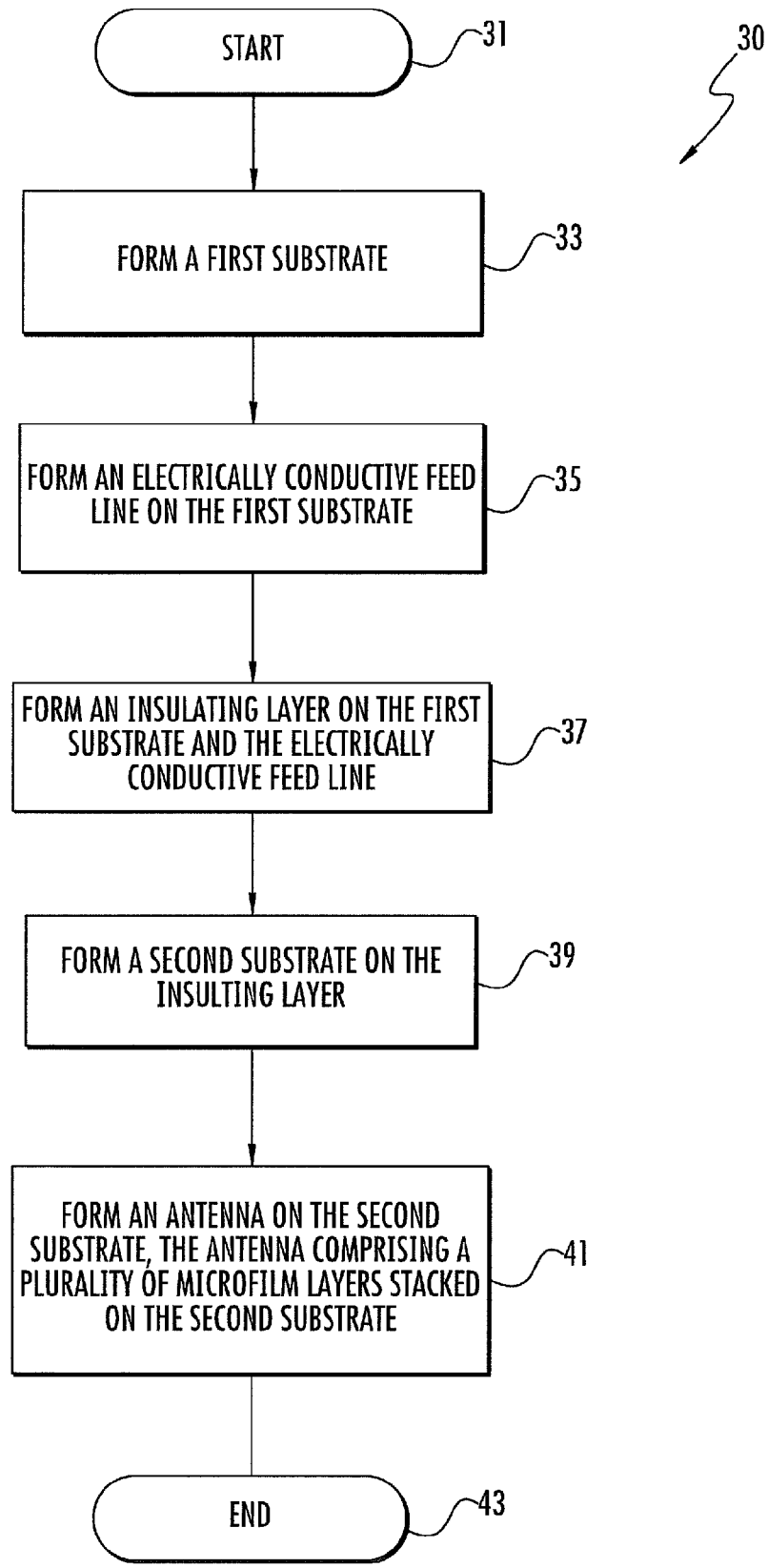
FIG. 2 is a flowchart illustrating a method of making the electronic device of FIG. 1.

Referring now to FIGS. 1A-2, an electronic device 10 according to the present invention is now described. Also, with reference to flowchart 30, a method for making the electronic device 10 is also described, which starts at Block 31. The electronic device 10 includes a first substrate 11, an electrically conductive feed line 12 on the first substrate, and an insulating layer 13 on the first substrate and the electrically conductive feed line.

The electronic device 10 includes a second substrate 15 on the insulating layer 13, and an antenna 16 on the second substrate and comprising a plurality of nanofilm layers 19a-19c stacked on the second substrate. The first substrate 11 may comprise a silicon layer, or another semiconductor, such as a Gallium Arsenide layer. That is to say, in some embodiments, the first substrate 11 could comprise solely silicon or solely Gallium Arsenide, while in others, the Gallium Arsenide could comprise a combination thereof. The second substrate 15 may comprise a silicon layer, and a silicon dioxide layer.

More specifically, the electronic device 10 includes an electrically conductive ground plane layer 14 between the insulating layer 13 and the second substrate 15. For example, the insulating layer 13 may comprise at least one of a silicon dioxide layer, and a dielectric laminate layer. In the electronic device 10, the electrically conductive ground plane layer 14 defines an aperture 18 extending from the insulating layer 13 to the second substrate 15 for coupling the electrically conductive feed line 12 to the antenna 16. In particular, the aperture (or via) 18 comprises a hollow aperture (i.e. air) for channeling electromagnetic waves, thereby coupling the electrically conductive feed line 12 to the antenna 16.

In some embodiments, each of the plurality of nanofilm layers 19a-19c comprises a carbon nanotube film layer configured to be electrically conductive. In other embodiments, each of the plurality of nanofilm layers 19a-19c comprises a metallic film layer (e.g. copper, aluminum, iron). The electronic device further comprises an IC component 22 on the first substrate 11 and coupled to the electrically conductive feed line 12. For example, the IC component 22 may comprise transceiver circuitry, i.e. amplifier, processor, etc. Additionally, each of the plurality of nanofilm layers 19a-19c has a thickness of less than 15 nm, and in some embodiments, less than 10 nm. In other words, this thickness value is in the nanometer range, ranging from several tens of nanometers to a few nanometers.

Another aspect is directed to a method of making an electronic device 10. The method may comprise forming a first substrate 11 (Block 33), forming an electrically conductive feed line 12 on the first substrate (Block 35), and forming an insulating layer 13 on the first substrate and the electrically conductive feed line (Block 37). The method may also include forming a second substrate 15 on the insulating layer 13 (Block 39), and forming an antenna 16 on the second substrate, the antenna comprising a plurality of nanofilm layers 19a-19c stacked on the second substrate (Blocks 41, 43).

An exemplary embodiment of the electronic device 10 is now described. A reliable and efficient system-on-chip, or an inter-chip wireless microwave or higher frequency data transfer system may necessitate the internal integration of an antenna with the integrated circuit. One approach to the integrated technique is to fabricate an antenna comprising nanomaterials that are compatible with the materials and fabrication procedure being used to fabricate the integrated circuit chip.

An aperture coupled microstrip antenna, where the active patch is composed of ultra-thin metallic nanofilms, such as 10 nm thick iron and 15 nm thick aluminum film, as well as vertically grown carbon nanotubes, has been demonstrated to work effectively. Such an antenna structure also provides an approach to the problems associated with making reliable direct electrical contacts to nanomaterials.

The antenna structure disclosed herein can be directly integrated into an IC using the materials used to fabricate the integrated circuit. FIG. 1A depicts a sketch of the antenna structure 10. A silicon IC technology is used in this description for convenience. The same description can be applied for other fabrication technologies, such as Gallium Arsenide based ICs.

The feed line connects 12 the IC 22 to the antenna structure 16. Depending on the specific fabrication method, the feed line 12 can comprise highly doped polysilicon or a metal line, deposited using the traditional or non-traditional fabrication procedures. On top of the feed line 12 is a layer of $SiO_2$ 13, which can be either grown or deposited. The ground plane 14 can either comprise highly doped polysilicon or a metal line, deposited using traditional or non-traditional procedures. The "aperture" or hole in the ground plane 14 is fabricated by etching or pre-defined in the mask used to develop the ground plane. The ground plane 14 is electrically connected to the electrical ground of the IC 22. On top of the ground plane 14 is deposited a layer of silicon to form an insulating layer 15. Polysilicon, $SiO_2$, or even a combination of Si and $SiO_2$ can also be used in place. A discussion shortly follows on how a combination of Si and $SiO_2$ for this layer provides an additional degree of freedom in selecting the frequency of operation for such an antenna.

The patch 16 is the active radiating part of the antenna device 10, and comprises an ultra-thin metallic nanofilm, deposited using traditional or non-traditional fabrication procedures. For example, an aluminum film, a few nanometers to a few 10's of nanometers can be deposited using an EvoVac Deposition System, as available from Angstrom Engineering, Inc. of Kitchener, Ontario, Canada, where aluminum is thermally evaporated. Of course, other conventional devices that deposit thin film layers could be used.

Herein follows the results from simulating the performance of an antenna structure 10 shown in FIG. 1A. For the simulations, the following dimensions were considered: patch 16: 4.3 mm×5.9 mm; silicon substrate 18: 10 mm×10 mm×0.38 mm; silicon dioxide 13: 25 mm×20 mm×0.508 mm; Conducting feeding line: 15 mm×0.972 mm; and through-hole diameter: 0.8 mm. For the patch 16, an aluminum thin-film with a thickness of 50 nm was considered, where a bulk conductivity value of 38 MS/m, relative permittivity ($\in r$) of 1, and relative permeability ($\mu r$) of 1.000021 were used.

Figure 3:
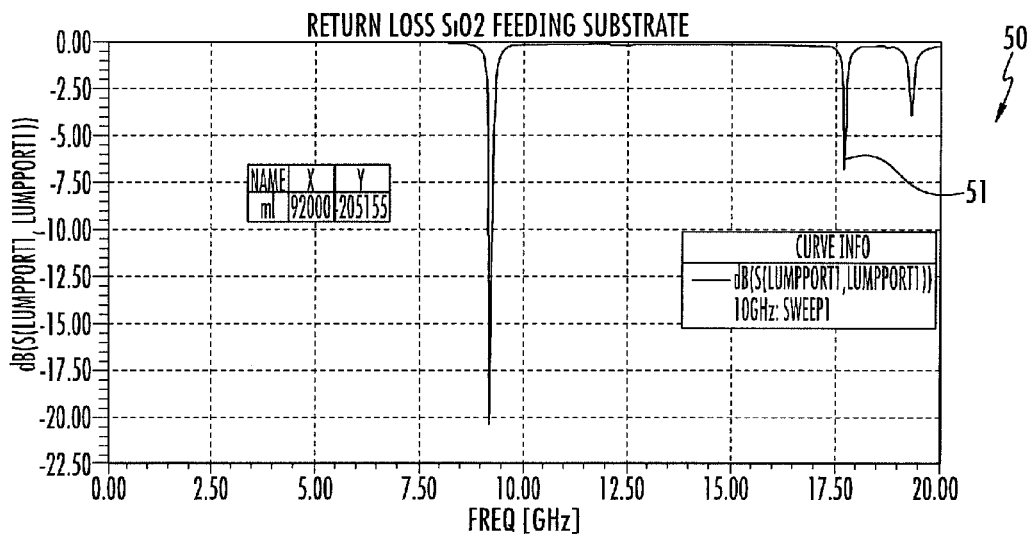
FIGS. 3-4 are charts illustrating performance of an example embodiment of the electronic device of FIG. 1.

FIG. 3 shows a diagram 50 including a curve 51 for the return loss of the antenna 10 as a function of frequency. As can be seen, the antenna 10 shows a return loss of over −20 dB at a frequency of 9.2 GHz, which makes it an excellent antenna. The frequency of operation of such an antenna can also be changed using the same fabrication technology, without changing the overall dimensions of the antenna. This can be accomplished through the use of a combination of different silicon based materials for layer 15 in FIG. 1A.

The simulation results are based upon using a combination of Si and $SiO_2$ for layer 15 in FIG. 1A, instead of only Si. In some embodiments, the layer 15 may comprise $Si/SiO_2$, and the SiO2 in layer 13 may comprise RT Duroid (done to demonstrate the effectiveness and versatility of aperture coupled ultrathin nanofilm antennas). The other materials remain the same.

Figure 4:
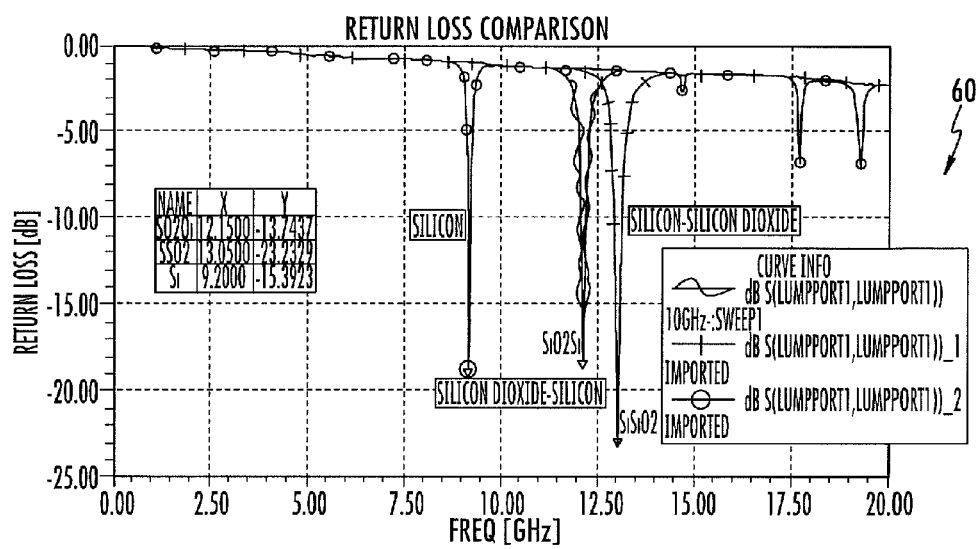

FIG. 4 shows a diagram 60 of the return loss as a function of frequency for three different scenarios:
1. (curve with circle mark) Layer 15 comprises only of Si with a thickness of 0.19 mm. This is done for comparison.
2. (curve with wave mark) Layer 15 comprises Si on top of $SiO_2$. Each has a thickness of 0.19 mm (?).
3. (curve with dash mark) Layer 15 is composed of $SiO_2$ on top of Si. Each has a thickness of 0.19 mm All other dimensions remain the same as used to obtain the results in FIG. 3. As can be seen, the combination of different Si based materials, instead of only Si, can be used to control the frequency at which the antenna resonates.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A system-on-chip electronic device comprising:
   a first substrate;
   an electrically conductive feed line on said first substrate;
   an insulating layer on said first substrate and said electrically conductive feed line;
   an electrically conductive ground plane layer on said insulating layer and defining an aperture;
   a second substrate on said electrically conductive ground plane layer and covering said aperture;
   an antenna on said second substrate, said antenna comprising at least one nanofilm layer stacked on said second substrate, each of said at least on nanofilm layer comprising a carbon nanotube film layer configured to be electrically conductive;
   said aperture being hollow and for electrically coupling said electrically conductive feed line to said antenna; and
   an integrated circuit (IC) component on said first substrate and coupled to said electrically conductive feed line.

2. The system-on-chip electronic device of claim 1 wherein said at least one nanofilm layer comprises a plurality of nanofilm layers.

3. The system-on-chip electronic device of claim 1 wherein said insulating layer comprises at least one of a silicon dioxide layer and a dielectric laminate layer.

4. The system-on-chip electronic device of claim 1 wherein said first substrate comprises at least one of a silicon layer and a Gallium Arsenide layer.

5. The system-on-chip electronic device of claim 1 wherein said electrically conductive feed line comprises doped polysilicon.

6. The system-on-chip electronic device of claim 1 wherein said electrically conductive feed line comprises a metallic material.

7. The system-on-chip electronic device of claim 1 wherein said second substrate comprises silicon and silicon dioxide.

8. The system-on-chip electronic device of claim 1 wherein said second substrate comprises a plurality of different silicon based materials.

9. The system-on-chip electronic device of claim 1 wherein said IC component has an operational frequency of 9.2 GHz; and wherein said aperture has a diameter of 0.8 mm.

10. The system-on-chip electronic device of claim 1 wherein each of said at least one nanofilm layer has a thickness of less than 15 nm.

11. A system-on-chip electronic device comprising:
a first substrate;
an electrically conductive feed line on said first substrate;
an insulating layer on said first substrate and said electrically conductive feed line;
an electrically conductive ground plane layer on said insulating layer and defining an aperture;
a second substrate on said electrically conductive ground plane layer and covering said aperture;
an antenna on said second substrate, said antenna comprising a plurality of nanofilm layers stacked on said second substrate;
said aperture being hollow and for electrically coupling said electrically conductive feed line to said antenna; and
an integrated circuit (IC) component on said first substrate and coupled to said electrically conductive feed line.

12. The system-on-chip electronic device of claim 11 wherein each of said plurality of nanofilm layers comprises a carbon nanotube film layer configured to be electrically conductive.

13. The system-on-chip electronic device of claim 11 wherein each of said plurality of nanofilm layers comprises a metallic film layer.

14. The system-on-chip electronic device of claim 11 wherein said insulating layer comprises at least one of a silicon dioxide layer and a dielectric laminate layer.

15. The system-on-chip electronic device of claim 11 wherein said first substrate comprises at least one of a silicon layer and a Gallium Arsenide layer.

16. The system-on-chip electronic device of claim 11 wherein each of said plurality of nanofilm layers has a thickness of less than 15 nm.

* * * * *